United States Patent [19]

Guntersdorfer et al.

[11] 3,836,877

[45] Sept. 17, 1974

[54] PIEZOELECTRIC FILTER

[75] Inventors: Max Guntersdorfer, Zorneding; Helmut Thomann, Munich, both of Germany

[73] Assignee: Siemens Aktiengesellschaft, Berling & Munich, Germany

[22] Filed: June 27, 1973

[21] Appl. No.: 374,123

[30] Foreign Application Priority Data

June 27, 1972 Germany .......................... 2231467

[52] U.S. Cl. ...................... 333/72, 310/9.5, 310/9.8

[51] Int. Cl. ........................... H03h 9/26, H03h 9/32

[58] Field of Search .......... 333/72, 30; 310/9.7, 9.8, 310/9.5, 9.6

[56] References Cited

UNITED STATES PATENTS

| | | | |
|---|---|---|---|
| 2,830,274 | 4/1958 | Rosen et al. | 333/72 X |
| 2,943,279 | 6/1960 | Mattiat | 333/72 |
| 2,953,755 | 9/1960 | Mattiat | 333/72 |
| 2,974,296 | 3/1971 | Rosen | 33/72 |
| 3,621,309 | 11/1971 | Yokoyama | 310/8.7 |

*Primary Examiner*—James W. Lawrence
*Assistant Examiner*—Marvin Nussbaum
*Attorney, Agent, or Firm*—Hill, Gross, Simpson, Van Santen, Steadman, Chiara & Simpson

[57] ABSTRACT

A piezoelectric filter arrangement is provided utilizing a piezoelectric body on which are arranged pairs of input and output electrodes. The electrodes are electrically isolated from one another, and the piezoelectric body is permanently polarized so that the polarization is aligned between these pairs of electrodes.

6 Claims, 5 Drawing Figures

PIEZOELECTRIC FILTER

BACKGROUND OF THE INVENTION

Mechanical filter arrangements with piezoelectric bodies are known. In these arrangements, on a piezoelectric ceramic body which is permanently poled, there are arranged two pairs of electrodes each consisting of two areal electrodes, in each case two electrodes of different pairs of electrodes being arranged in one plane. The pairs of electrodes serve for the input and output coupling of acoustic waves.

A disadvantage of a filter arrangement such as that described above results from the fact that due to the high dielectric constant of the material of the piezoelectric body, cross-talk capacitances arise between the areal electrodes of different pairs.

BRIEF SUMMARY OF THE INVENTION

A primary aim of the present invention is to provide a piezoelectric filter arrangement in which cross-talk capacitances of this kind are avoided.

This aim is realised by a filter arrangement wherein cross-talk capacitances are avoided by having the characteristic two pairs of electrodes arranged on different faces of the piezoelectric body so that one electrode pair is rotated by 90° relative to another thereof, thus causing the electric fields which inherently occur between one electrode pair serving as input electrodes and the second electrode pair serving as output electrodes likewise to be rotated by 90° relative to one another.

Preferably the present invention aims at providing a piezoelectric filter arrangement which is characterised by having the piezoelectric body be of rectangular shape, so that, for each of the electrode pairs, there are provided two areal electrodes, arranged opposite one another, and further so that such electrode pairs are rotated by 90° relative to one another. In this arrangement, the planes of the areal electrodes of the respective individual electrode pairs lie at right angles to one another. The piezoelectric body is polarized between the associated areal electrodes of a pair in the direction of a field between such electrodes.

One embodiment of a filter arrangement in accordance with the invention is characterised by having the piezoelectric body permanently polarized between the associated areal electrodes of the electrode pairs in such a manner that the polarization between the input electrodes is at right angles to the plane of the surface of the output electrodes, and that the polarization between the output electrodes is at right angles to the plane of the surface of the input electrodes.

Another embodiment of a filter arrangement of this invention is characterized by having the piezoelectric body of rectangular shape with the electrode pairs being interdigital structures. Such structures are arranged on opposite faces of the piezoelectric body, and the fingers of the interdigital structures are rotated 90° relative to one another, that the piezoelectric body is polarized in such manner that the polarization is directed from the comb fingers of one electrode of one interdigital structure towards the comb fingers of the other electrode of the same interdigital structure.

Advantageously, a filter arrangement in accordance with the invention can be used as a filter arrangement in which the ceramic body serves as resonator body.

Other and further objects, purposes, advantages, utilities, and features will be apparent to those skilled in the art from a reading of the present specification and drawings.

BRIEF DESCRIPTION OF THE DRAWINGS

Further details of the invention may be gathered from the following description taken together with the appended drawings which illustrate preferred, exemplary embodiments of the present invention, and further developments thereof. Thus.

DETAILED DESCRIPTION

Figure 1:
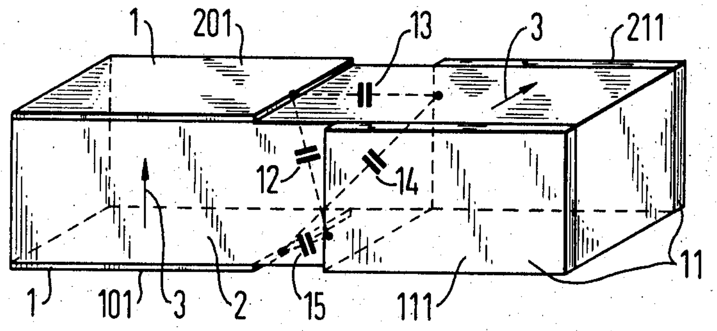
FIG. 1 shows a perspective schematic illustration of a piezoelectric filter embodiment of the present invention.

Referring to FIG. 1, there is seen a piezoelectric ceramic filter body 2, the faces of which are mounted electrode pairs 1 and 11. One electrode pair 1 comprises areal electrodes 101 and 201, and the second electrode pair 11 comprises areal electrodes 111 and 211. The electrode pair 1 serves, for example, to couple an acoustic wave into the body 2, while the electrode pair 11 serves as the output coupling of this wave. The electrode pairs 1 and 11 are rotated by 90° relative to one another in the manner shown in FIG. 1. The piezoelectric body is permanently polarized between the areal electrodes 101 and 201, and 111 and 211 respectively. The direction of this polarization in the embodiment of FIG. 1 is indicated by the arrows 3. It lies in the direction of the surface normal of the areal electrodes of each electrode pair 1 and 11.

The capacitances which occur between the individual electrodes 101 and 201 of the one electrode pair 1, and the electrodes 111 and 211 of the other electrode pair 11, equal one another in pairs, due to the filter arrangement produced between electrodes 1 and 11 in accordance with the present invention. In the FIG. 1, these capacitances are schematically illustrated and referenced by numerals 12, 13, 14 and 15. For example, the capacitances 12 and 13 which occur between the electrode 201 of the electrode pair 1 and the electrodes 111 and 211 of the electrode pair 11 are equal to one another.

When an alternating voltage is applied to the electrode pair 1, the latter is temporarily charged in a specific fashion. This charge of the areal electrodes of the electrode pair 1 causes charges to be induced across the electrodes of the electrode pair 11. As a result, in the embodiment of FIG. 1, the electrode pairs 1 and 11, in accordance with the present invention, the charges induced on each plate-shaped electrode cancel one another out.

Figure 2:
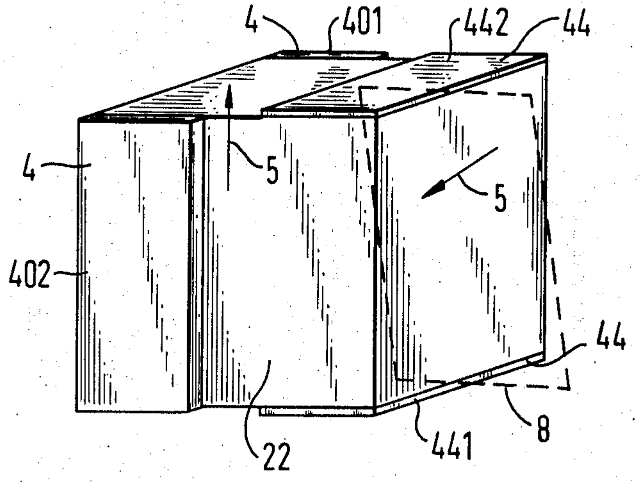
FIG. 2 is a view similar to FIG. 1 illustrating a second embodiment of the present invention.

FIG. 2 illustrates a filter arrangement of this invention in which the areal electrodes 401 and 402 of an electrode pair and the areal electrodes 441 and 442 of a second electrode pair 44 are again rotated by 90° relative to one another in the manner shown in the Figure. The piezoelectric body 22 is permanently polarized aligned between the electrode pairs. The direction of this polarization is such that the polarization between the input electrodes, for example the electrodes 402 and 401, is at right angles to the plane of the surface of the output electrodes, for example the electrodes 441 and 442, and that the polarization between the output electrodes is at right angles to the plane of the surface of the input electrodes. In the embodiment of FIG. 2, the direction of the polarization is indicated by the arrows 5.

When the alternating voltage is applied to the areal electrodes 402 and 401 of the electrode pair 4, the latter is temporarily charged in a specific fashion. This charge of the areal electrodes of the electrode pair 4 causes charges to be induced across the areal electrodes 441 and 442 of the electrode pair 44, which charges cancel one another out.

As a result of the application of an alternating voltage to the embodiment of FIG. 2, in accordance with the present invention, shearing waves arise which result in a deformation of the body 22 in the manner shown by the broken line 8 in the FIG. 2.

Figure 3:
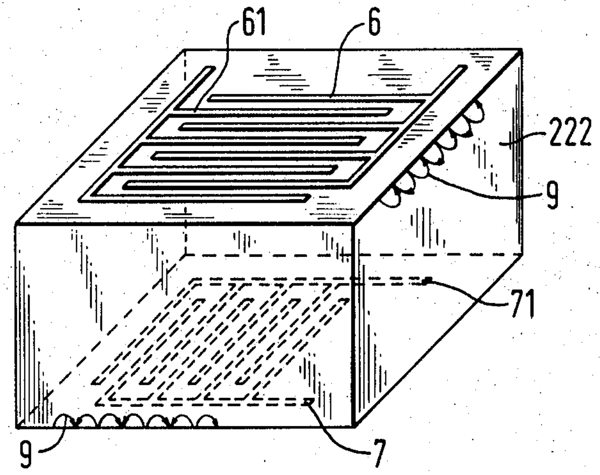
FIG. 3 is a view similar to FIG. 1 illustrating a third embodiment of the present invention.

FIG. 3 illustrates an embodiment of this invention wherein comb-like interdigital structures 6 and 61, and 7 and 71, respectively, are applied to opposite surfaces on the piezoelectric resonator body 222. In this case, in accordance with the invention, in order to avoid cross-talk capacitances, the interdigital structures are roated relative to one another by 90° in the manner shown in the Figure.

The body 222 possesses a periodic, permanently aligned surface polarization whose direction is indicated by the arrows 9 in FIG. 3. This polarization is directed from the comb fingers of one electrode, for example, the electrode 6 or 7 of an interdigital structure, towards the comb fingers of the other electrode, for example, the electrode 61 or 71 of the same interdigital structure. The volume wave coupled into the body 222 is propagated from the one such interdigital structure to the other interdigital structure thereof through the body 222, the front of this wave always lying parallel to the planes in which the interdigital structures are arranged.

In accordance with the invention, the capacitances which exist between one electrode, for example, electrode 6 or 61 of an interdigital structure, and the two other electrodes, for example, the electrodes 7 and 71 of the other interdigital structure, are equal to one another.

Figure 4:
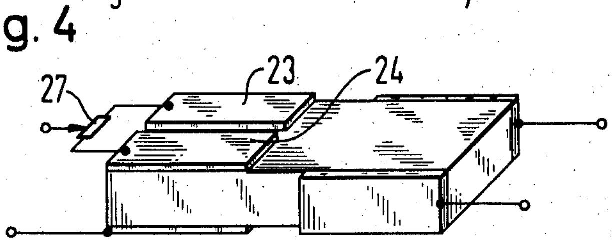
FIG. 4 is a view similar to FIG. 1 illustrating a fourth embodiment of the present invention.
Figure 5:
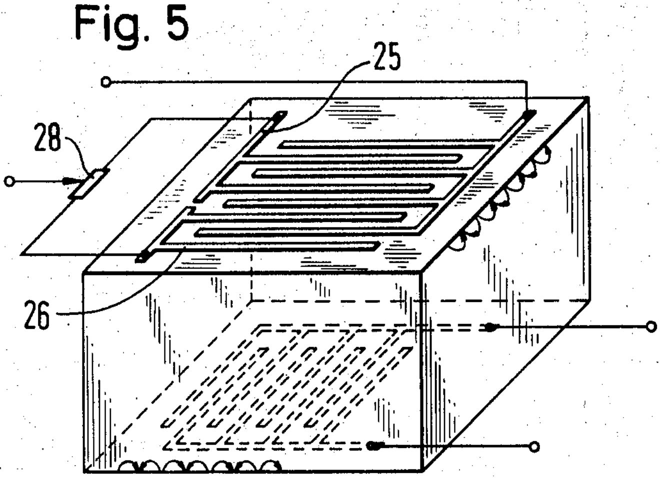
FIG. 5 is a view similar to FIG. 1 illustrating a fifth embodiment of the present invention.

To compensate for any inhomogeneities in the ceramic body or the electrode platings, in further developments of the embodiments in accordance with the invention, one of the four electrodes arranged on the body, as shown in respective FIGS. 4 and 5, is divided into two subsidiary electrodes 23, 24 and 25, 26. The two subsidiary electrodes are connected to one another via a potentiometer 27 and 28, respectively, the central tapping of which forms one of the four poles of each embodiment. Any residual cross-talk may be reduced to zero by adjusting the potentiometer, as those skilled in the art will appreciate.

In embodiments of the present invention which are connected in such manner that the input circuit and the output circuit are asymmetric to earth, disturbing cross-talk capacitances can be avoided by using two filter embodiments of the present invention connected in a chain. There is thus obtained a balanced network between the input and output of such a combination arrangement.

Other and further embodiments and variations of the present invention will become apparent to those skilled in the art from a reading of the present specification taken together with the drawings, and no undue limitations are to be inferred or implied from the present disclosure.

The claims are:

1. A filter device comprising

A. a piezoelectric body having a first pair of spaced, opposed, generally parallel faces and a second pair of spaced, opposed, generally parallel faces, said second pair being generally normally disposed relative to said first pair, B. a first pair of electrodes, each one on a different one of the faces of said first pair of faces, C. a second pair of electrodes, each one on a different one of the faces of said second pair of faces, said second pair being electrically isolated from said first pair of electrodes, D. said body being permanently polarized between each of said first pair of electrodes and said second pair of electrodes, respectively, said polarization being exclusively in the direction which is perpendicular to each of said first pair of electrodes in the region between said first pair of electrodes, and exclusively in the direction which is perpendicular to each of said second pair of electrodes in the region between said second pair of electrodes.

2. The device of claim 1, wherein said piezoelectric is of rectangular shape.

3. A filter device comprising

A. a piezoelectric body having a first pair of spaced, opposed, generally parallel faces and a second pair of spaced, opposed, generally parallel faces, said second pair being generally normally disposed relative to said first pair, B. a first pair of electrodes, each one on a different one of the faces of said first pair of faces, C. a second pair of electrodes, each one on a different one of the faces of said second pair of faces, said second pair being electrically isolated from said first pair of electrodes, D. said body being permanently polarized between each of said first pair of electrodes and said second pair of electrodes, respectively, said polarization being perpendicular to each of said first pair of electrodes and said second pair of electrodes, wherein one of the four electrodes is divided into two subsidiary electrodes and each of these two subsidiary electrodes are interconnected with one another via a potentiometer, the potentiometer central tapping being one pole of the four poles of the device.

4. A filter device comprising

A. a piezoelectric body having a pair of spaced, opposed generally parallel faces, B. a first pair of electrodes, on one of the faces of said pair of faces, each one comprising a plurality of interlaced spaced parallel finger-like members, the ends of which at one common end are joined together by a single trunk electrode, C. a second pair of electrodes, on a different one of said pair of faces, each one comprising a plurality of interlaced spaced parallel finger-like members, the ends of which at one common end are joined together by a single trunk electrode, D. said body being permanently polarized between each of said first pair of electrodes and said second pair of electrodes, respectively.

5. The device of claim 4, wherein said piezoelectric is of rectangular shape.

6. The device of claim 4, wherein one of the four electrodes is divided into two subsidiary electrodes and each of these two subsidiary electrodes are interconnected with one another via a potentiometer, the potentiometer central tapping being one pole of the four poles of the device.

* * * * *